(12) United States Patent
Rhodes et al.

(10) Patent No.: US 6,960,796 B2
(45) Date of Patent: Nov. 1, 2005

(54) CMOS IMAGER PIXEL DESIGNS WITH STORAGE CAPACITOR

(75) Inventors: Howard Rhodes, Boise, ID (US); Jeff McKee, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/303,897

(22) Filed: Nov. 26, 2002

(65) Prior Publication Data

US 2004/0099886 A1 May 27, 2004

(51) Int. Cl.[7] .................... H01L 27/148; H01L 29/768
(52) U.S. Cl. .................. 257/222; 257/223; 257/225
(58) Field of Search .................. 257/222, 223, 257/225

(56) References Cited

U.S. PATENT DOCUMENTS

| | | | |
|---|---|---|---|
| 5,461,425 A | * 10/1995 | Fowler et al. | ............... 348/294 |
| 5,841,159 A | 11/1998 | Lee et al. | |
| 5,898,209 A | 4/1999 | Takakura | |
| 5,965,875 A | 10/1999 | Merrill | |
| 6,150,683 A | 11/2000 | Merrill et al. | |
| 6,204,524 B1 | * 3/2001 | Rhodes | ....................... 257/222 |
| 6,262,703 B1 | 7/2001 | Perner | |
| 6,300,662 B1 | 10/2001 | Doyle et al. | |
| 6,310,366 B1 | 10/2001 | Rhodes et al. | |
| 6,326,652 B1 | 12/2001 | Rhodes | |
| 6,429,470 B1 | * 8/2002 | Rhodes | ....................... 257/225 |
| 6,741,283 B1 | 5/2004 | Merrill et al. | |
| 6,744,084 B2 | 6/2004 | Fossum | |

OTHER PUBLICATIONS

Watanabe et al., Hemispherical Grained Si Formation . . . Capacitor, Jul. 1995, IEEE Transactions on Electron Devices, vol. 42, pp. 1252–1253.*

* cited by examiner

*Primary Examiner*—Mary Wilczewski
*Assistant Examiner*—Monica Lewis
(74) *Attorney, Agent, or Firm*—Dickstein Shapiro Morin & Oshinsky LLP

(57) ABSTRACT

A charge storage capacitor which is connected to various light sensitive and/or electrical elements of a CMOS imager, as well as methods of formation, are disclosed. The charge storage capacitor may be formed entirely over a field oxide region of the CMOS imager, entirely over an active area of a pixel sensor cell, or partially over a field oxide region and partially over an active pixel area of a pixel sensor cell.

22 Claims, 10 Drawing Sheets

CMOS IMAGER PIXEL DESIGNS WITH STORAGE CAPACITOR

FIELD OF THE INVENTION

The present invention relates to improved semiconductor imaging devices and, in particular, to a CMOS imager employing a storage capacitor in the pixel sensor cell.

BACKGROUND OF THE INVENTION

CMOS imagers have been increasingly used as low cost imaging devices. A fully compatible CMOS sensor technology enabling a higher level of integration of an image array with associated processing circuits is beneficial in many digital imaging applications such as, for example, cameras, scanners, machine vision systems, vehicle navigation systems, video telephones, computer input devices, surveillance systems, auto focus systems and star trackers, among many others.

In a conventional CMOS imager, the active elements of a pixel cell perform the necessary functions of: (1) photon to charge conversion; (2) accumulation of image charge; (3) transfer of charge to a floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate.

Exemplary CMOS imaging circuits as well as detailed descriptions of the functions of various CMOS elements of an imaging circuit are described, for example, in U.S. Pat. No. 6,204,524 to Rhodes, U.S. Pat. No. 6,310,366 to Rhodes et al. and U.S. Pat. No. 6,326,652 to Rhodes, the disclosure of which are incorporated by reference herein.

Since prior CMOS imagers suffer from poor signal to noise ratios and poor dynamic range as a result of the inability to fully collect and store the electric charge collected by the photosensitive area, storage capacitors have been proposed for use in connection with the light sensitive node of a CMOS pixel sensor cell to improve collected charge storage. For example, U.S. Pat. No. 6,204,524 to Rhodes describes in detail the formation of planar and trench storage capacitors electrically connected in parallel to the light sensitive node of a CMOS pixel sensor cell and formed partially over the field oxide region and partially over the active pixel region.

Applicants of the present invention have discovered that storage capacitors may also provide useful results when electrically connected to other light sensitive and/or electrical elements of the pixel sensor cell, such as transistor gates or floating diffusion regions, for example, to affect the operation and characteristics of such various light sensitive and/or electrical elements. Capacitors connected to such various light sensitive and/or electrical elements of the pixel sensor cell help amplify the signal of an imager transistor, increase the storage capacitance of a photosite, or provide a low noise decoupling capacitor. Such capacitors may be formed entirely over the active area of the pixel sensor cell, or entirely over the field oxide area, or over both the active area and the field oxide area.

SUMMARY OF THE INVENTION

The present invention provides CMOS imagers having storage capacitors electrically connected to various light sensitive and/or electrical elements of a pixel sensor cell of a CMOS imager, to affect the operation and characteristics of such various light sensitive and/or electrical elements, add charge storage capability to the pixel sensor cell, independently set charge amplification, and improve the lag and scalability of pixel cells.

According to one embodiment of the present invention, a charge storage capacitor is formed electrically connected to a floating diffusion region of a pixel sensor cell and to an AC ground. The charge storage capacitor may be formed entirely overlying the field oxide region isolating a pixel sensor cell, or entirely overlying the active area of the imager, or partially over the field oxide area and partially over the active area.

According to another embodiment of the present invention, a charge storage capacitor is formed electrically connected to and in parallel with a gate of a CMOS imager transistor, for example, a charge transfer transistor, to tailor the voltage pulses to the transfer gate and the charge transfer characteristics of the transistor. The charge storage capacitor may be formed entirely overlying the field oxide region, or entirely overlying the active area of the pixel sensor cell, or partially over the field oxide area and partially over the active area.

In yet another embodiment of the present invention, a plurality of storage capacitors are formed over a field oxide region isolating a pixel sensor cell, and further connected to various light sensitive or electrical elements of the imager, for example, one storage capacitor may be connected to a floating diffusion region and another storage capacitor may be connected to a charge collection region. Again, each of the charge storage capacitors may be formed entirely overlying the field oxide region, or entirely overlying the active area of a pixel sensor cell, or partially over the field oxide area and partially over the active area.

Other embodiments provide a capacitor at one or more other connection locations of a pixel sensor cell, which can be formed entirely over a field oxide area, entirely over an active pixel area, or over a portion of a field oxide area and an active pixel area.

Also provided are methods of forming the CMOS imagers containing charge storage capacitors formed entirely over a field oxide area, entirely over an active pixel area, or only over a portion of an active pixel area.

Additional advantages and features of the present invention will be apparent from the following detailed description and drawings which illustrate preferred embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion.

Figure 1:
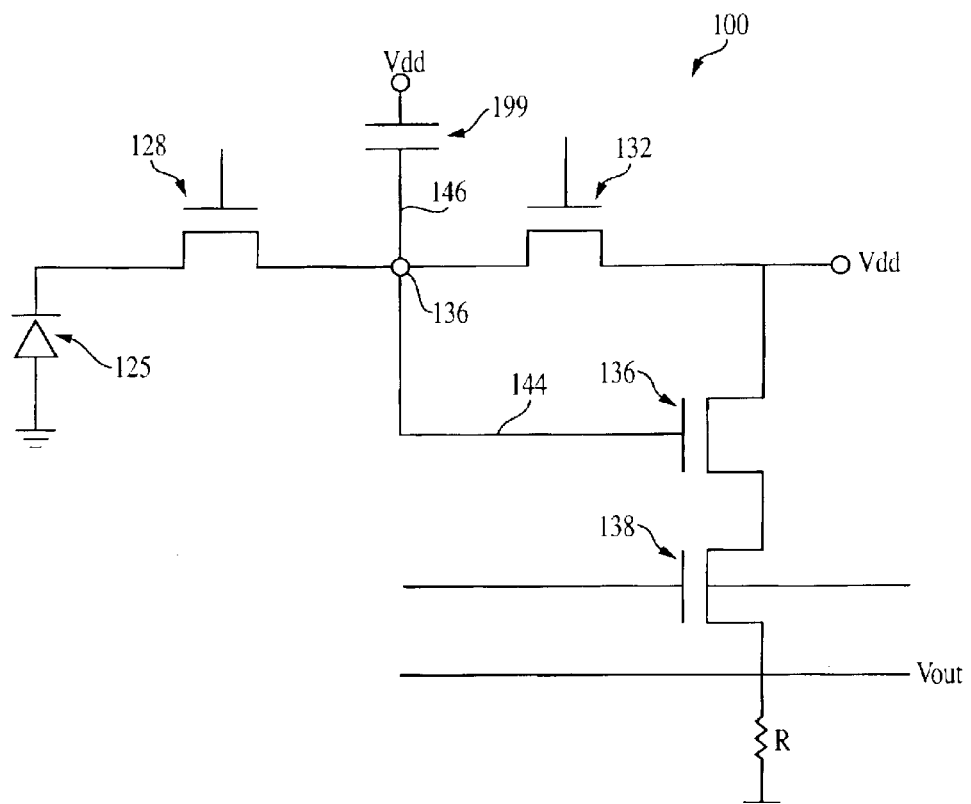
FIG. 1 is a schematic diagram of a pixel sensor cell fabricated in accordance with a first embodiment of the present invention.
Figure 2:
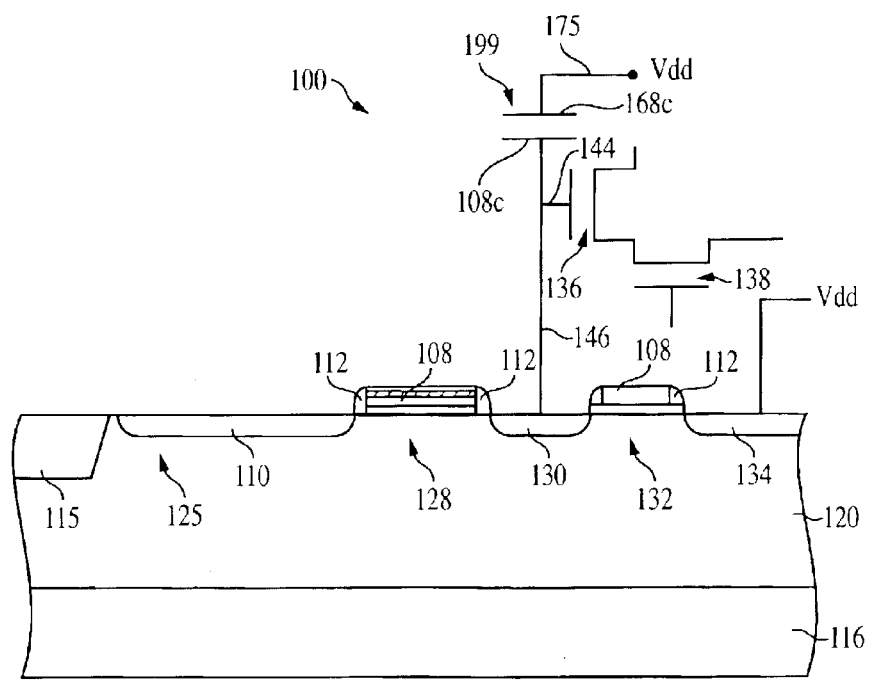
FIG. 2 is another part schematic part cross-sectional substrate view of the pixel sensor cell of FIG. 1.
Figure 3:
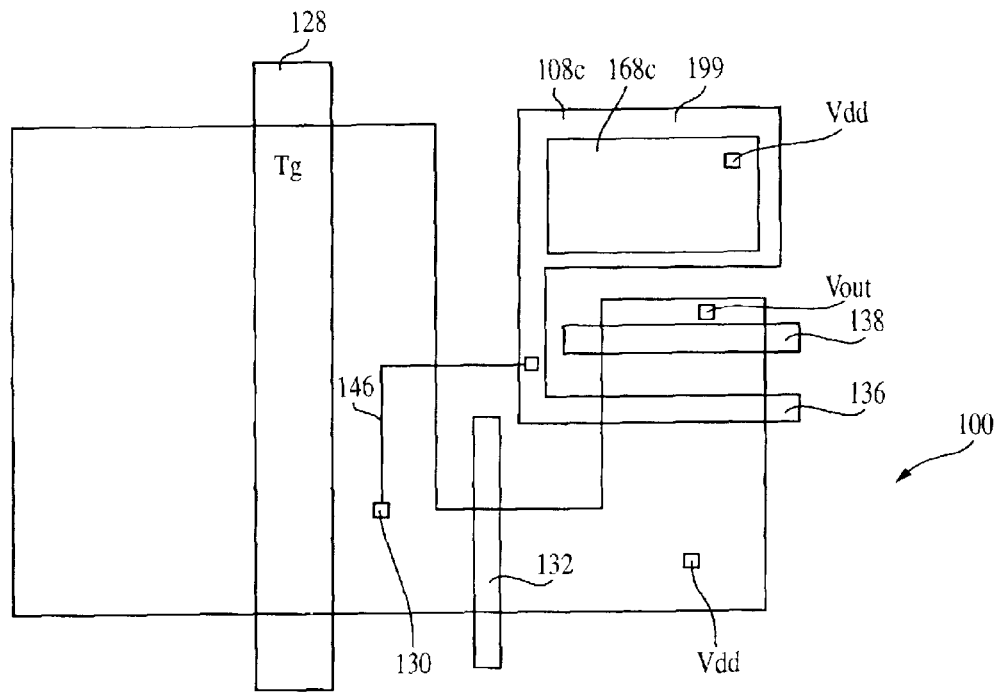
FIG. 3 is a top planar view of the pixel sensor cell of FIG. 1.

Referring now to the drawings, where like elements are designated by like reference numerals, FIGS. 1–10 illustrate a first exemplary embodiment of the invention. A pixel sensor cell 100 (FIGS. 1–3 and 10) is illustrated having a storage capacitor 199 (FIGS. 1–3 and 10) overlying field oxide region 115 and electrically connected to a floating diffusion region 130 and to AC ground. As explained in more detail below, the storage capacitor 199 is formed so that it does not block any light sensitive areas of the imager. In addition and as illustrated in FIG. 3, for example, the storage capacitor 199 is formed overlying the field oxide region 115 entirely, without blocking the floating diffusion region 130. However, the storage capacitor 199 may be also formed entirely over the active area, or only partially over the field oxide area and partially over the active area, as desired.

It should be noted that, although the invention will be described below in connection with use in a four-transistor (4T) pixel cell, the invention also has applicability to all CMOS imagers including but not limited to a three-transistor (3T) cell, which differs from the 4T cell in the omission of a charge transfer transistor described below. Accordingly, an embodiment showing use of the invention in a 3T pixel cell is also discussed below.

Figure 5:
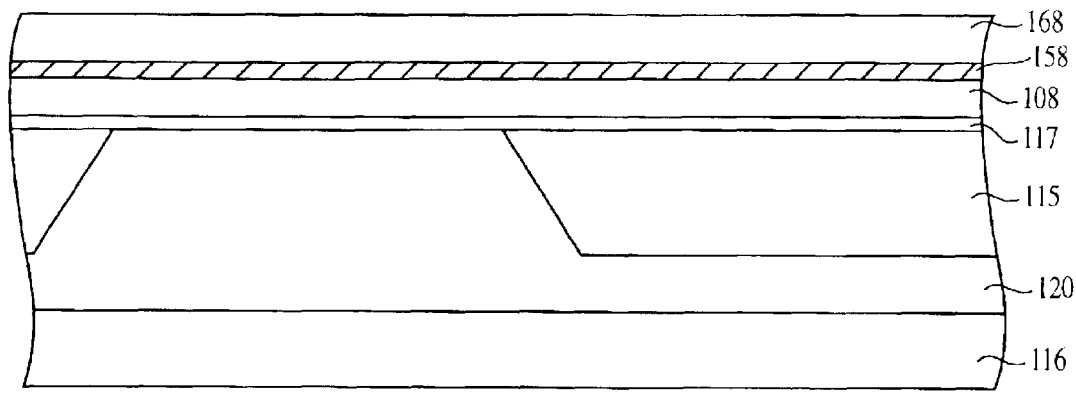
FIG. 5 illustrates a cross-sectional view of the pixel sensor cell of FIG. 4 at a stage of processing subsequent to that shown in FIG. 4.
Figure 6:
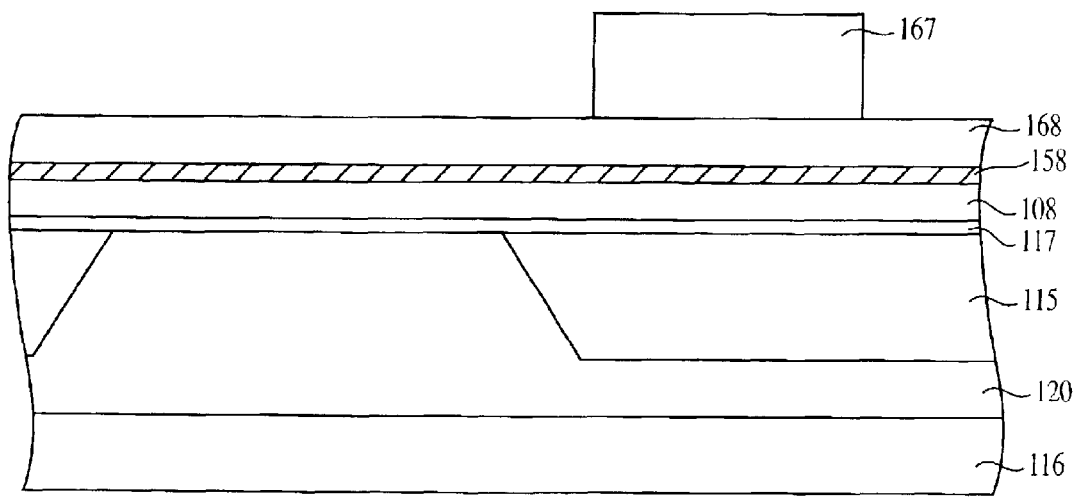
FIG. 6 illustrates a cross-sectional view of the pixel sensor cell of FIG. 4 at a stage of processing subsequent to that shown in FIG. 5.

FIGS. 1 and 2 are schematic illustrations of the pixel sensor cell 100 showing a four-transistor (4T) cell with the storage capacitor 199 electrically connected in parallel with floating diffusion region 130. For a better understanding of the present invention, FIG. 3 illustrates a top view of the pixel sensor cell 100 of FIGS. 5 and 6, depicting the storage capacitor 199 electrically connected to the floating diffusion region 130. The four transistors illustrated in FIGS. 1–3 can be identified by their gates, that is transfer transistor gate 128, reset transistor gate 132, source follower transistor gate 136 and row select transistor gate 138. This way, the storage capacitor 199 stores charge on the floating diffusion 130 and contributes to setting the charge to voltage amplification of the sensor.

FIG. 2 is a more detailed illustration of the transfer transistor having gate 128 and of the reset transistor having gate 132 of FIG. 1 as well as of photodiode 125 electrically connected to gate 128 of the transfer transistor. As shown in FIG. 2, the pixel sensor cell 100 of the first embodiment is formed in a substrate 116 having a doped layer 120 of a first conductivity type, which for exemplary purposes is treated as a p-type substrate. A field oxide region 115, which serves to surround and isolate the pixel sensor cell 100, may be formed before the formation of the storage capacitor 199. The field oxide region 115 is formed by any known technique such as thermal oxidation of the underlying silicon in a LOCOS process, or by etching trenches and filling them with oxide in an STI process.

The doped layer 120 of FIG. 2 is provided with three doped regions 110, 130 and 134, which are doped to a second conductivity type, which for exemplary purposes is treated as n-type. The first doped region 110 is the doped region that forms the photodiode 125. The second doped region 130 is the floating diffusion region, sometimes also referred to as a floating diffusion node. The third doped region 134 is the drain of the reset transistor 131 and is also connected to voltage source Vdd.

The floating diffusion region 130 is connected to the source follower transistor gate 136 by a contact line 144

(FIG. 2) which is typically a metal contact line. The floating diffusion region 130 is also connected to bottom electrode 108c of the storage capacitor 199 by contact line 146 (FIG. 2), which, as described below, is preferably a metal contact line. In the preferred embodiment, the material forming the source follower gate 136, typically formed of poly, poly/WSix, polyTiSi$_2$ or poly/WNx/W, acts as the source follower gate when over active area. When the material forming the source follower gate 136 extends over the field oxide area, it acts as the bottom electrode 108c. Dielectric 158c, which is typically formed of an oxide such as SiO$_2$, Al$_2$O$_5$ or Ta$_2$O$_5$, a nitride, or an oxide/nitride combination, overlies the bottom electrode 108c. As described in detail below, top capacitor electrode 168c overlies the dielectric 158c and is connected through a contact and a metal line 175 to AC ground, which can be a DC ground or a DC supply voltage, Vdd.

The source follower transistor 136 outputs a signal proportional to the charge accumulated in the floating diffusion region 130 to a readout circuit 60 when the row select transistor 138 is turned on. While the source follower transistor 136 and row select transistor 138 are illustrated in FIG. 2 in circuit form above substrate 120, it should be understood that these transistors are typically formed in substrate 120 in a similar fashion to transistors 128 and 132, as shown in FIG. 3.

Figure 4:
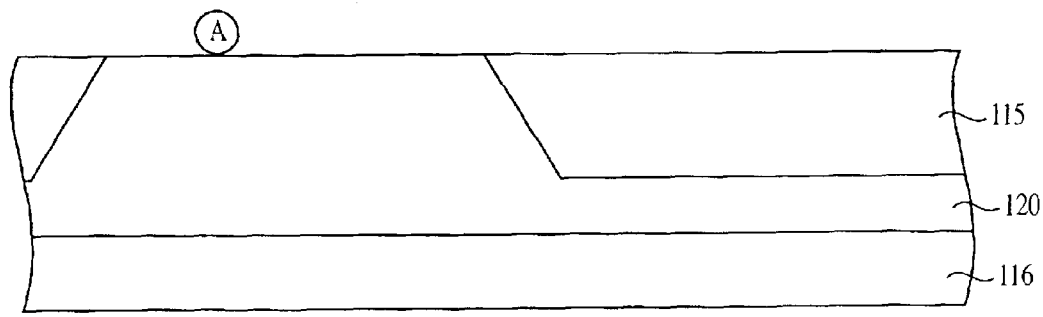
FIG. 4 illustrates a cross-sectional view of a pixel sensor cell of according to an embodiment of the present invention and at an initial stage of processing.

The storage capacitor 199 of the pixel sensor cell 100 of FIGS. 1–3 is fabricated by a process described as follows and illustrated in FIGS. 4–10. Referring now to FIG. 4, a substrate 116, which may be any of the types of substrates described above, is doped to form a doped substrate layer 120 of a first conductivity type, which for exemplary purposes will be described as p-type. Any suitable doping process may be used, such as ion implantation. Further, the invention has equal application to other semiconductor substrates, for example, silicon-germanium, germanium, silicon-on-insulator, silicon-on-saphire, or gallium-arsenide substrates, among others. Also illustrated in FIG. 4 is field oxide region 115, which surrounds and isolates active area A (FIG. 4) of the later formed pixel sensor cell 100. The field oxide region 115 may be formed by well-known LOCOS or STI processes.

Referring now to FIG. 5, an insulating layer 117 is formed over the substrate 116 and the field oxide region 115 by thermal growth or chemical vapor deposition, or other suitable means. The insulating layer 117 may be formed of silicon dioxide, silicon nitride, or other suitable insulating material, and to a thickness of approximately 2 to 100 nm. As shown in FIG. 5, the insulating layer 117 completely covers the substrate 116.

Subsequent to the formation of the insulating layer 117, a first conductive layer 108, a dielectric layer 158 and a second conductive layer 168 are sequentially formed over the insulating layer 117, as also illustrated in FIG. 5. The first conductive layer 108, which will simultaneously form a first or bottom electrode 108c of the storage capacitor 199 and a gate of the source follower transistor 136, may be formed of any conductive material. Non-limiting examples of materials that may be used to form the first conductive layer 108 are doped polycrystalline silicon (referred to herein as polysilicon or poly), poly/WSix, polyTiSi$_2$, poly/WNx/W, among others. The first conductive layer may be also formed of doped polycrystalline silicon in combination with tungsten nitride (WNx) or tungsten silicon (WSix), or a combination of tungsten nitride and tungsten in addition to polysilicon. The first conductive layer 108 may be formed over the insulating layer 117 by CVD, LPCVD, PECVD, MOCVD, sputtering (PVD) or other suitable deposition techniques.

The dielectric layer 158 (FIG. 5) may be formed over the first conductive layer 108 by various known methods, such as chemical vapor deposition (CVD), rapid thermal nitridation (RTN) processing, or the like. The term "dielectric" or "insulator" as used in this application shall be understood to mean any solid material that can sustain an electrical field for use in the capacitor of an integrated circuit device containing a capacitor. The dielectric layer 158 may be formed of any insulating material, for example, oxides such as silicon oxide or TEOS, nitrides such as silicon nitride, ONO, NO (nitride oxide) or ON (oxide nitride), high-k dielectrics such as Ta$_2$O$_5$, Al$_2$O$_3$ or BST, ferroelectrics, or the like. The preferred dielectric layer is a nitride layer which can be formed by a CVD method.

The second conductive layer 168, which will form a second electrode 168c of the storage capacitor 199, is patterned and formed over the dielectric layer 158. In addition, the second conductive layer 168 may be formed of the same or different conductive materials from those used for the first conductive layer 108. Non-limiting examples of materials that may be used to form the second conductive layer 168 are doped polycrystalline silicon (referred to herein as polysilicon or poly), platinum, tungsten, TiN, refractory metals, RuO$_2$, Ir, IrO$_2$, Rh, RhO$_x$, and alloys, such as Pt—Ru or Pt—Rh. The second conductive layer 168 may be also formed of poly/WSix, poly/WNx/W or polyTiSi$_2$. The second conductive layer 168 may be formed over the dielectric layer 158 by CVD, LPCVD, PECVD, MOCVD, sputtering (PVD) or other suitable deposition techniques. Preferably, both the first and second conductive layers are formed of doped polysilicon with a nitride dielectric layer 158 formed between the two conductive layers 108, 168.

Figure 7:
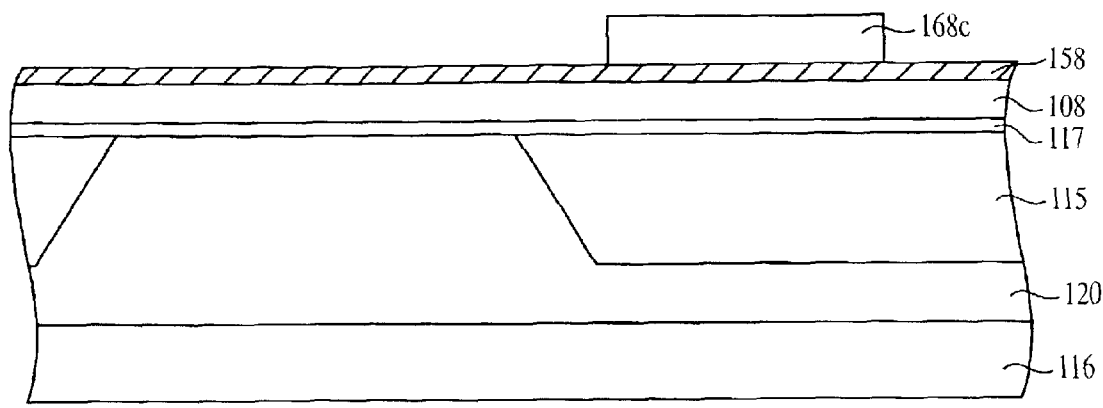
FIG. 7 illustrates a cross-sectional view of the pixel sensor cell of FIG. 4 at a stage of processing subsequent to that shown in FIG. 6.
Figure 8:
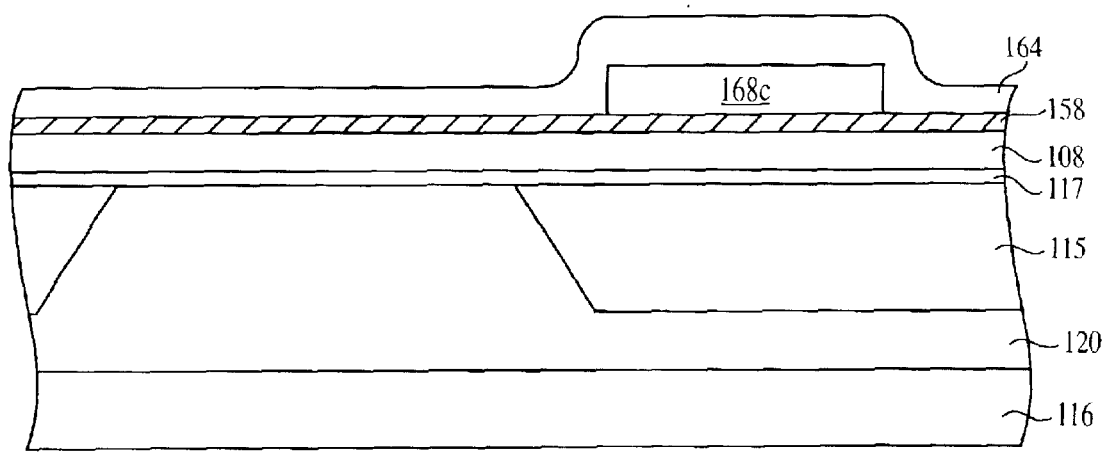
FIG. 8 illustrates a cross-sectional view of the pixel sensor cell of FIG. 4 at a stage of processing subsequent to that shown in FIG. 7.

Next, the structure of FIG. 5 is patterned using a first photoresist layer 167 (FIG. 6) formed over the second conductive layer 168 to a thickness of about 1,000 Angstroms to about 20,000 Angstroms. The first photoresist layer 167 (FIG. 6) is patterned with a mask (not shown) and the second conductive layer 168 is etched to obtain a second capacitor electrode 168c formed over the field oxide region 115, as illustrated in FIG. 7. Subsequent to the formation of the second capacitor electrode 168c, the first photoresist layer 167 is removed by conventional techniques, such as oxygen plasma An insulating layer 164 is then deposited over the second capacitor electrode 168c and the dielectric layer 158, as shown in FIG. 8. The insulating layer 164 may be any insulating material, such as silicon oxide, silicon dioxide, silicon nitride, USG, BPSG, PSG or BSG, or the like.

Figure 9:
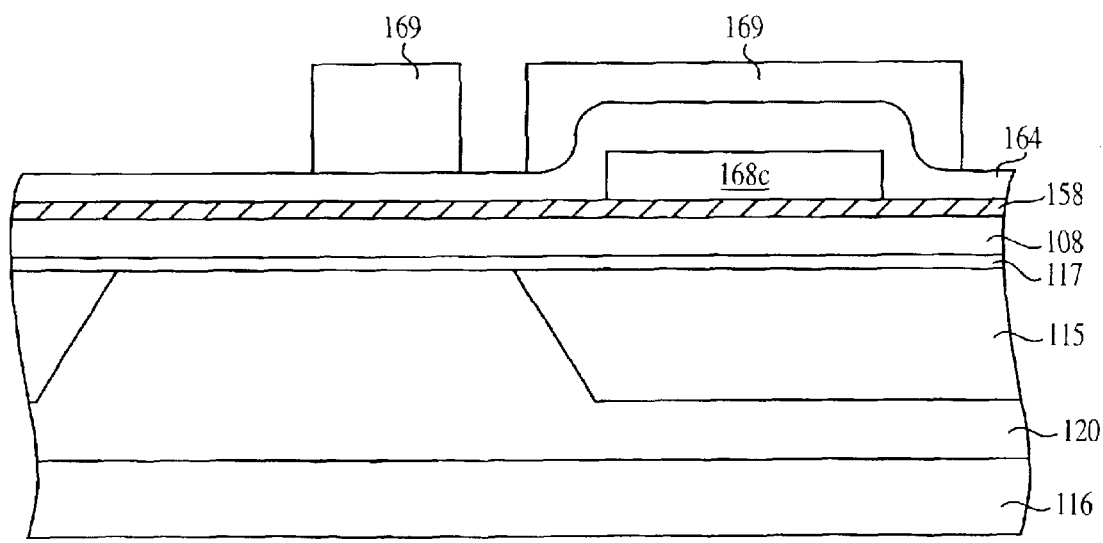
FIG. 9 illustrates a cross-sectional view of the pixel sensor cell of FIG. 4 at a stage of processing subsequent to that shown in FIG. 8.
Figure 10:
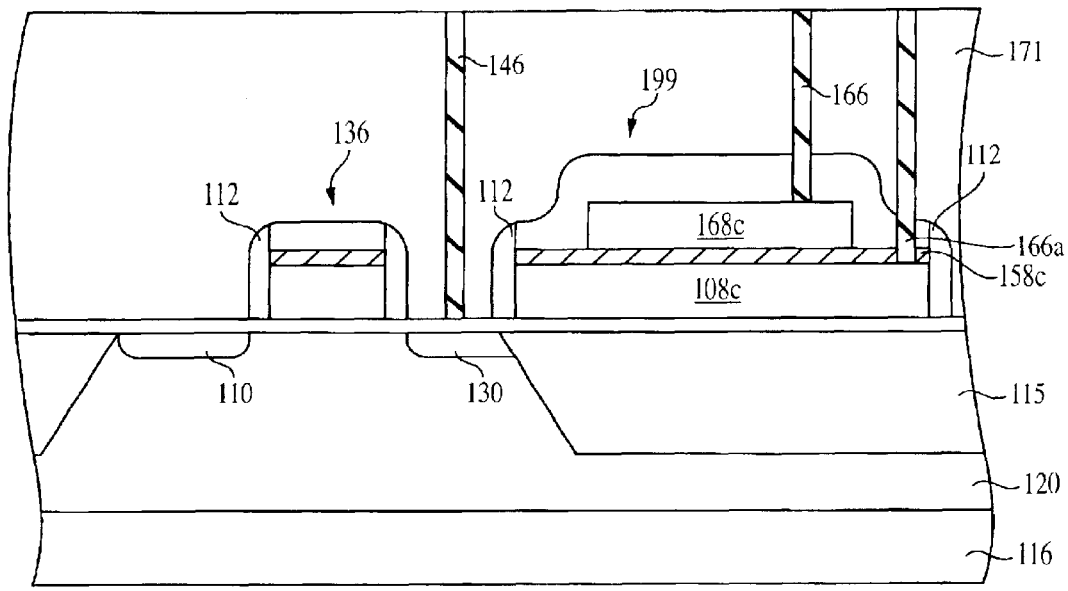
FIG. 10 illustrates a cross-sectional view of the pixel sensor cell of FIG. 4 at a stage of processing subsequent to that shown in FIG. 9.

Referring now to FIG. 9, a second photoresist layer 169 is formed over the insulating layer 164 to a thickness of about 1,000 Angstroms to about 20,000 Angstroms. The second photoresist layer 169 (FIG. 9) is patterned with a mask (not shown) and the insulating layer 164, the dielectric layer 158 and the first conductive layer 108 are etched through the patterned photoresist to simultaneously obtain source follower gate stack 136 and completed storage capacitor 199, as shown in FIG. 10. The gate stack 136 is located over the active area of the pixel cell and the storage capacitor 199 is located over the field oxide region 115. The gate stack 128 comprises conductive layer 108g formed preferably of polysilicon, gate dielectric layer 158g and insulating layer 164. The storage capacitor 199 (FIG. 10) comprises first capacitor electrode 108c, dielectric 158c and the second capacitor electrode 168c. Spacers 112 are then formed on the sides of source follower gate stack 136 and of the capacitor 199. Ion implantations are conducted to set transistor voltages, create conductive diffusions and implant the photodiode. Insulating oxide 171 (FIG. 10) is then deposited and planarized.

Holes are then etched and contacts 146, 166 and 166a (FIG. 10) are formed through the planarized insulating oxide 171. Contacts 146, 166 and 166a are formed by applying a photoresist and a mask (not shown) over the planarized oxide layer 171 so that photolithographic techniques could define the areas to be etched out to form the holes for the contacts 146, 166, 166a to the desired electrical circuit. This etching may be done at the same time as the etching for the contact holes for the photogate and reset gate, as described below. The contacts 146, 166, 166a may be filled by depositing therein a conductive material, such as doped polysilicon, or a metal such as titanium/titanium nitride/tungsten or $TiSi_2/TiN/W$. As set forth above, the storage capacitor 199 may be formed over any field oxide region of the pixel cell 100.

After the patterning of the storage capacitor 199 and of the gate stack 136 of the source follower transistor, gate stack 132 (FIG. 2) of the reset transistor and gate stack 138 of the row select transistor are now formed. Although, for simplicity, the above embodiment has been described with reference to the formation of the gate stack 136 and the formation of the storage capacitor 199, the invention is not limited to this embodiment. Accordingly, the present invention also contemplates the formation of the storage capacitor 199, and all transistor gates 128, 132, 136 and 138 in the array and all necessary elements in the periphery support circuits.

The processing steps for the fabrication of the reset transistor gate 132, transfer transistor gate 128 and photodiode 125 will not be described in detail below, as they are known in the art. Insulating sidewall spacers 112 (FIG. 2) are also formed on the sides of all gate stacks 128, 132, 136, 138 and the capacitor stack 199. These sidewalls may be formed of, for example, silicon dioxide, silicon nitride, or ONO. While these gate stacks may be formed before or after the process of the photodiode 125, for exemplary purposes and for convenience the photodiode formation has been described as occurring after transistor gate stack formation.

After the formation of the insulating sidewall spacers 112, doped regions 110, 130 and 134 are then formed in the doped layer 120. Any suitable doping process may be used, such as ion implantation. A resist and mask (not shown) are used to shield areas of the layer 120 that are not to be doped. Three doped regions are formed in this step: doped region 110 which serves as the photodiode area; doped region 130 which is floating diffusion region 130 (which connects to the storage capacitor 199 by contact 146 and to the source follower transistor 136 by metal 144 as shown in FIGS. 1–2); and doped region 134 which is a drain region.

As noted earlier, the doped regions 110, 130 and 134 are doped to a second conductivity type, which for exemplary purposes will be considered to be n-type. Several masks may be used to implant the regions 110, 130 and 134 to the same or different doping concentrations. Preferably, the doped regions 110, 130 and 134 are heavily n-doped with arsenic, antimony or phosphorous at a dopant concentration level of from about $1\times10^{15}$ ions/cm$^2$ to about $1\times10^{16}$ ions/cm$^2$. Preferably, the doped region 110 is a lightly n-type doped region of phosphorous at a dopant concentration of $1\times10^{12}$ ions/cm$^2$ to about $1\times10^{14}$ ions/cm$^2$.

The photosensor cell 100 is essentially complete at this stage, and conventional processing methods may now be used to form wiring to connect gate lines and other connections in the pixel cell. Accordingly, the entire surface of the substrate 116 is metallized to provide contacts to the floating diffusion, reset gate, transfer gate, Vdd and capacitor. Conventional multiple layers of conductors and insulators may also be used to interconnect the photosensor cell structures.

It should be understood that fabrication of the FIG. 1 structure is not limited to the methods described with reference to the attached figures. For example, the doped regions 110, 130 and 134 may be formed in the doped layer 120 before the gates 128 and 132 are formed over the substrate. Additionally, the gates 128, 132, 136 and 138 may be formed before the storage capacitor 199.

In addition, although the above embodiment was described with reference to the formation of the reset transistor 132, transfer gate transistor 128, and row select transistor 138 subsequent to the formation of the storage capacitor 199, it must be understood that the invention also contemplates the formation of these transistors prior to the formation of the storage capacitor 199.

Figure 11:
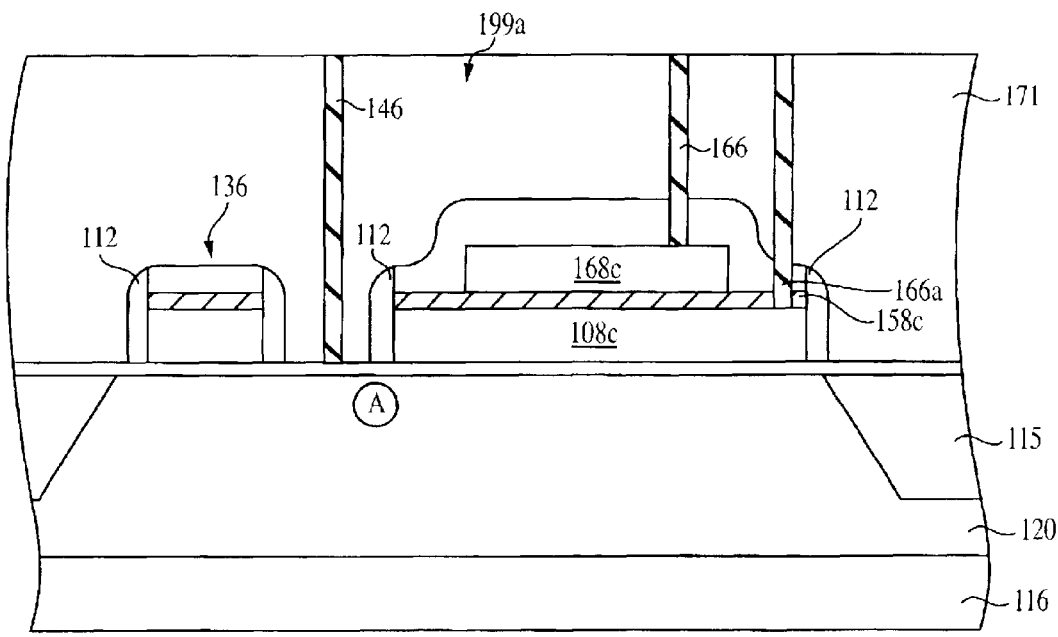
FIG. 11 illustrates a cross-sectional view of a pixel sensor cell fabricated according to another embodiment of the present invention.

Although the above embodiment was described with reference to the formation of the storage capacitor 199 entirely overlying the field oxide region 115, the invention also contemplates the formation of a storage capacitor formed entirely overlying an active area of a pixel sensor cell. For example, FIG. 11 illustrates storage capacitor 199a formed entirely over the active area A of the pixel sensor cell 100.

Figure 12:
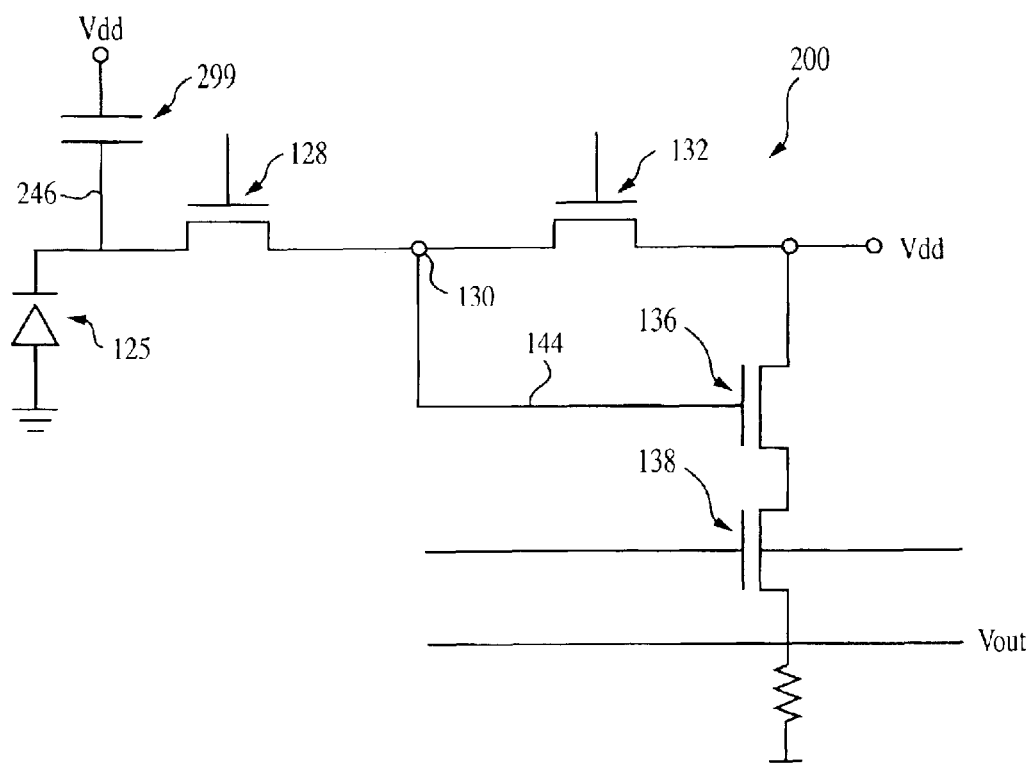
FIG. 12 is a schematic diagram of a pixel sensor cell fabricated in accordance with a second embodiment of the present invention.
Figure 13:
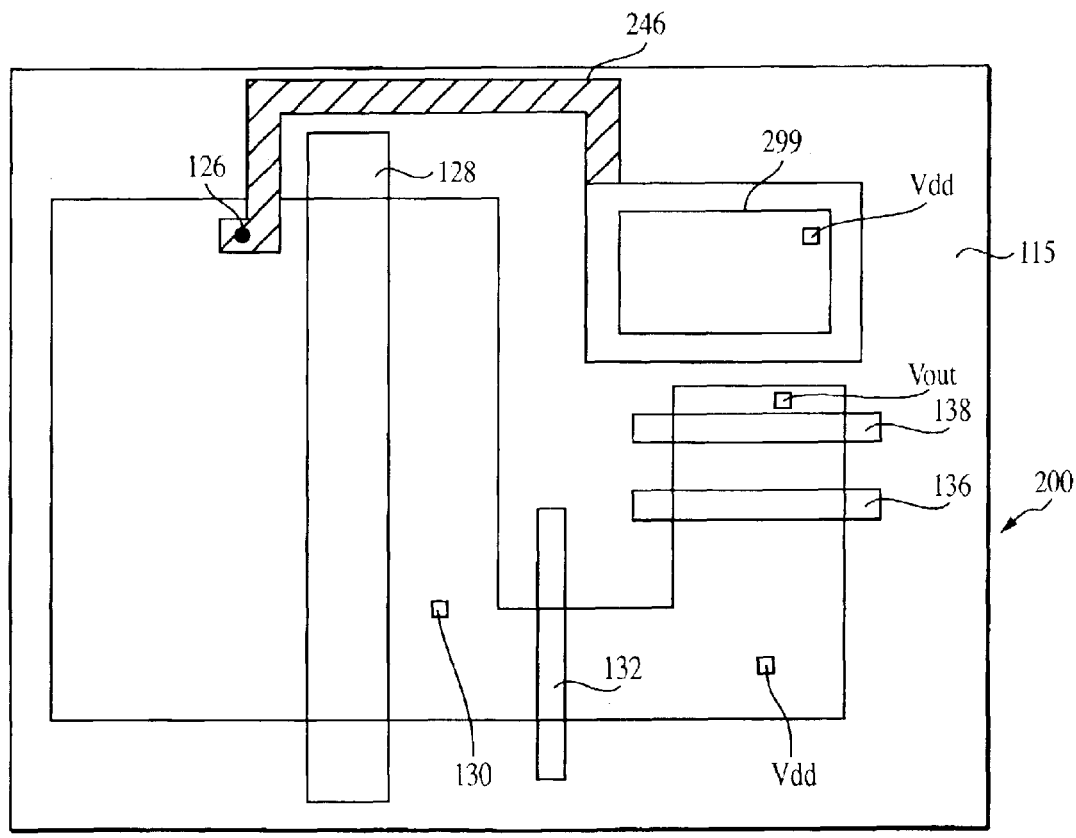
FIG. 13 is a top planar view of the pixel sensor cell of FIG. 12.

The structure of a pixel cell 200 of a second embodiment of the present invention is illustrated with reference to FIGS. 12–13. It should be understood that similar reference numbers correspond to similar elements as previously described with reference to FIGS. 1–11. The structure of FIG. 12 differs from the above-described embodiment in that storage capacitor 299 is formed in contact with the photodiode region 125 or 110, and not with the floating diffusion region 130, as in the previous embodiment.

The processing of the second embodiment is similar to the processing described above with reference to FIGS. 4–11, except that metal contact 246 (FIG. 13) connects an electrode of the storage capacitor 299 to the photodiode region 110 and not to the floating diffusion region 130, as in the above-described embodiment. Again, the storage capacitor 299 may be formed entirely or only partially over the field oxide region 115, as well as entirely or only partially over the active area of the pixel sensor cell. If the storage capacitor 299 is formed entirely over the field oxide region 115, the advantage is that the storage capacitor 299 improves the charge storage capacity of the imager without reducing the size of the photosensitive area.

Figure 14:
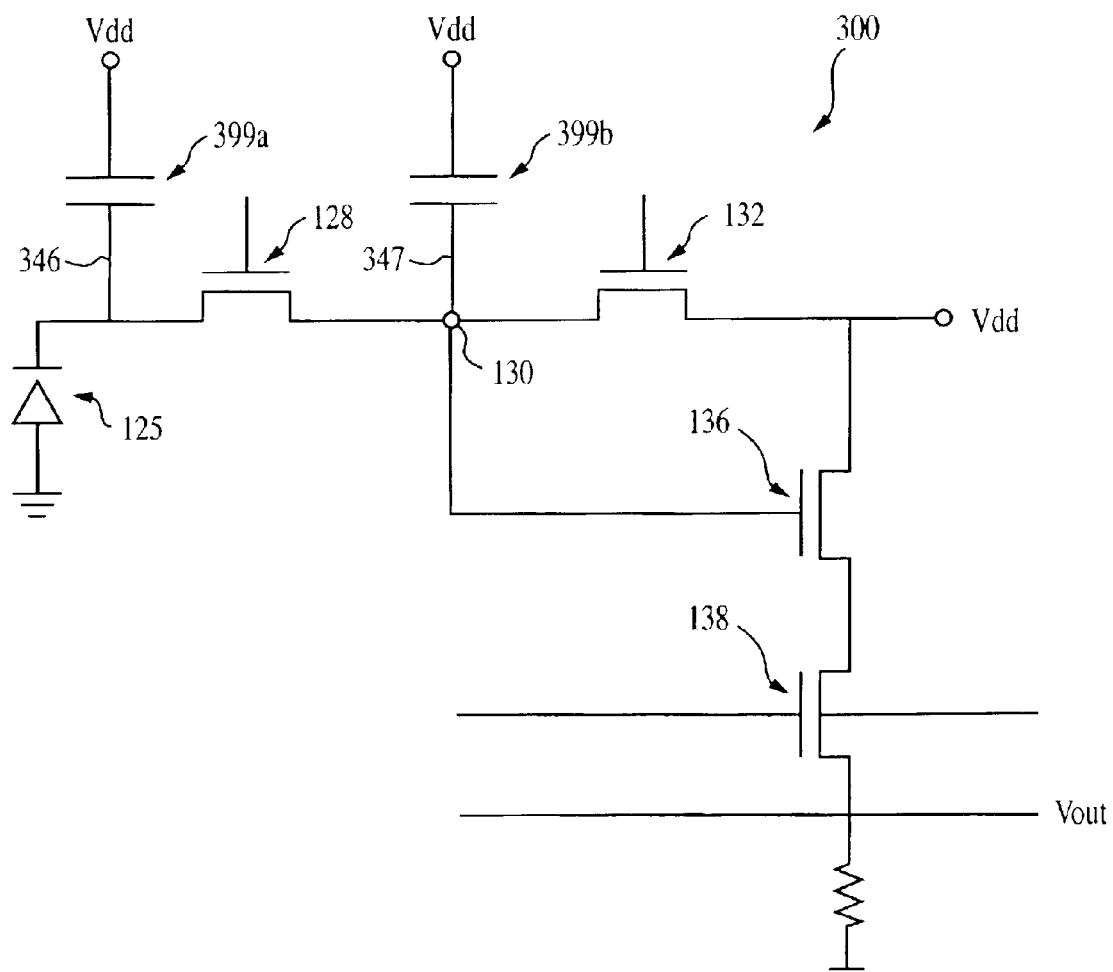
FIG. 14 is a schematic diagram of a pixel sensor cell fabricated in accordance with a third embodiment of the present invention.

FIG. 14 illustrates yet another embodiment of the present invention according to which two different storage capacitors are connected to two different elements of pixel sensor cell 300. For example, FIG. 14 depicts storage capacitor 399a, which is connected to the photodiode 125, and storage capacitor 399b, which is connected to the floating diffusion region 130. Both storage capacitors 399a, 399b of pixel sensor cell 300 (FIG. 14) may be formed totally overlying the field oxide region 115, without reducing the photosensitive area of the pixel cell, or only partially over the field oxide region 115. Storage capacitors 399a, 399b of pixel sensor cell 300 (FIG. 14) may be also formed totally overlying the photosensitive area of the pixel cell, or only partially over the active area. The processing for the formation of the storage capacitors 399a, 399b of pixel sensor cell 300 of FIG. 14 are similar to the processing steps described above with reference to FIGS. 4–11, except that two capacitors (and not one capacitor) are formed over the field oxide region. In addition, contact 346 (FIG. 14) and contact 347 (FIG. 14) connect each of the lower electrode of the storage capacitors 399a, 399b to the photodiode region 125 or 110 and to the floating diffusion region 130, respectively. Preferably, contacts 346, 347 are formed of a conductive material, such as doped polysilicon, or a metal such as titanium/titanium nitride/tungsten. Photolithographic techniques are used to define the areas to be etched out to form the holes for the contacts 346, 347 wherein the conductive material is subsequently depositing therein.

Although FIG. 14 illustrates only two storage capacitors 399a, 399b, it must be understood that the present invention is not limited to this embodiment. Accordingly, the invention contemplates the formation of a plurality of such storage capacitors which are formed entirely or only partially over the field oxide region, and which are further connected to various light sensitive and/or electrical elements of the pixel sensor cell.

Figure 15:
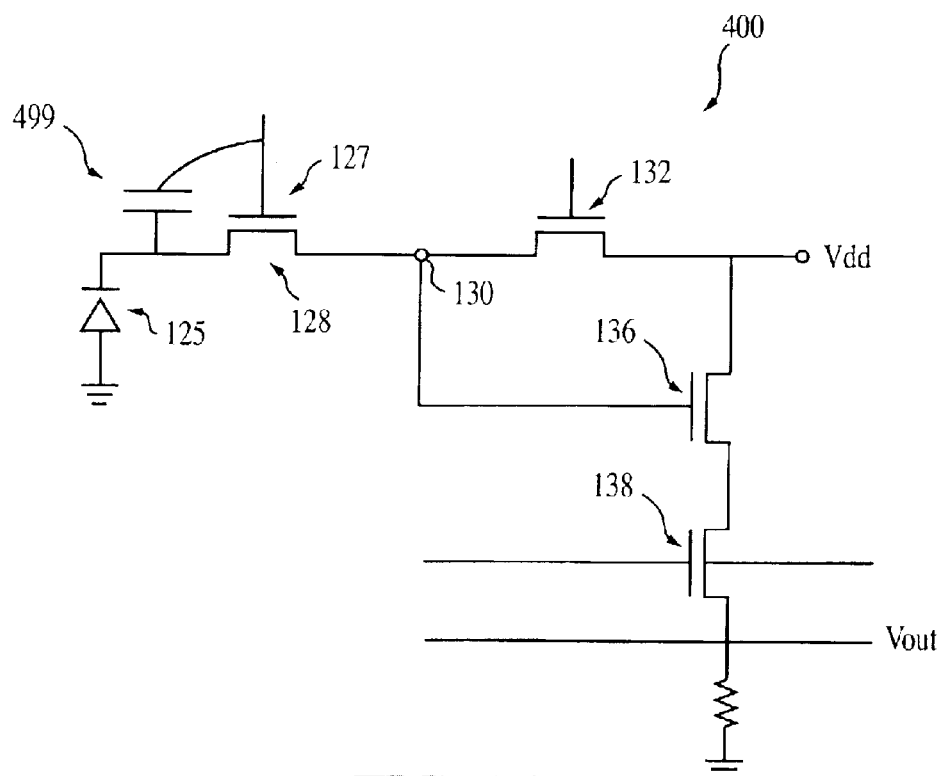
FIG. 15 is a schematic diagram of a pixel sensor cell fabricated in accordance with a fourth embodiment of the present invention.
Figure 16:
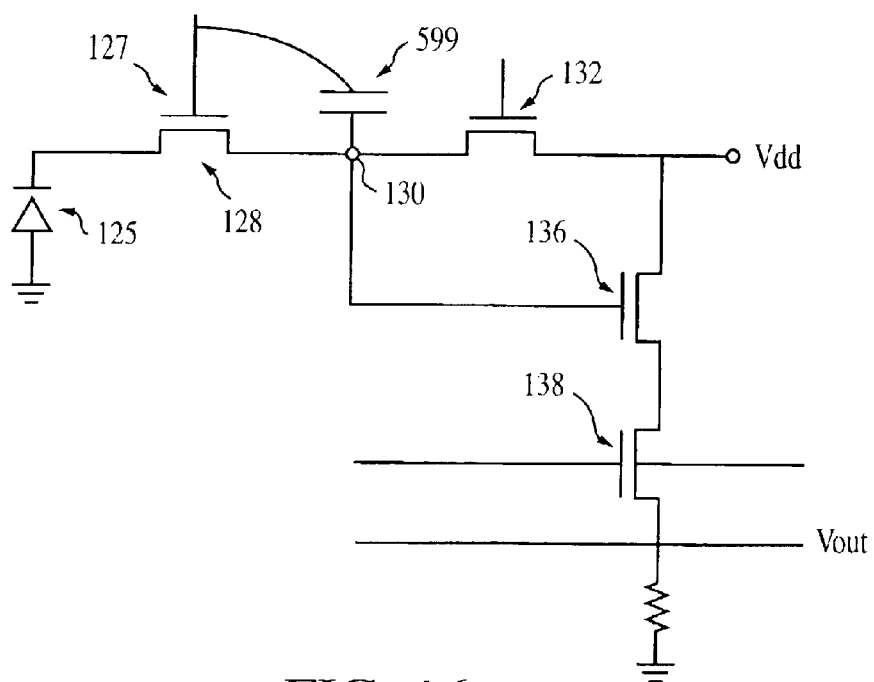
FIG. 16 is a schematic diagram of a pixel sensor cell fabricated in accordance with a fifth embodiment of the present invention.
Figure 17:
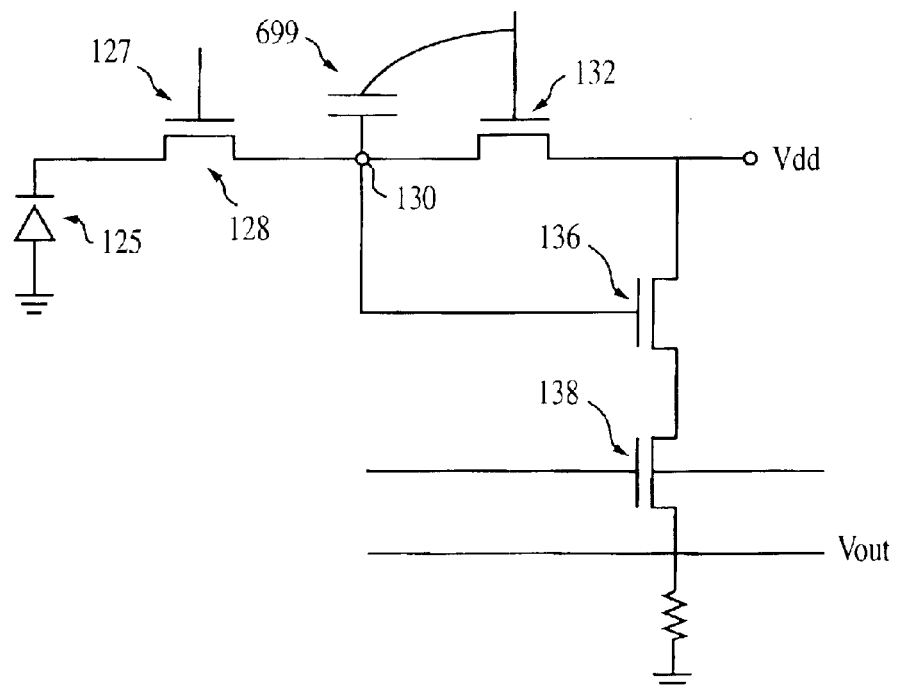
FIG. 17 is a schematic diagram of a pixel sensor cell fabricated in accordance with a sixth embodiment of the present invention.

FIGS. 15–17 illustrate additional embodiments of the present invention, according to which a storage capacitor is connected not to an AC ground source, as in the previous embodiments, but rather to a gate of one of the four transistors of the 4T cell. For example, FIG. 15 illustrates storage capacitor 499 of a pixel sensor cell 400 formed entirely or partially over the field oxide region 115, and connected to both the photodiode 125 and to the gate stack 127 of the transfer transistor 128. In another exemplary embodiment, FIG. 16 depicts storage capacitor 599 formed over the field oxide region 115 and also connected to both the floating diffusion region 130 and to the gate stack 127 of the transfer transistor 128. According to yet another exemplary embodiment, storage capacitor 699 of FIG. 17 is formed over the field oxide region 115 and is further connected to both the floating diffusion region 130 and to a gate of the reset transistor 132.

In each of the embodiments depicted in FIGS. 15–17, the processing steps for the fabrication of the storage capacitors 499, 599 and 699 are similar to the processing steps described above with reference to FIGS. 4–11, except that the upper electrode of each of the storage capacitors 499, 599 and 699 is connected not to a ground potential, as in the first embodiment, but rather to another element of the CMOS imager, for example, a gate of one of the four transistors of the pixel sensor cell, as described above.

Figure 18:
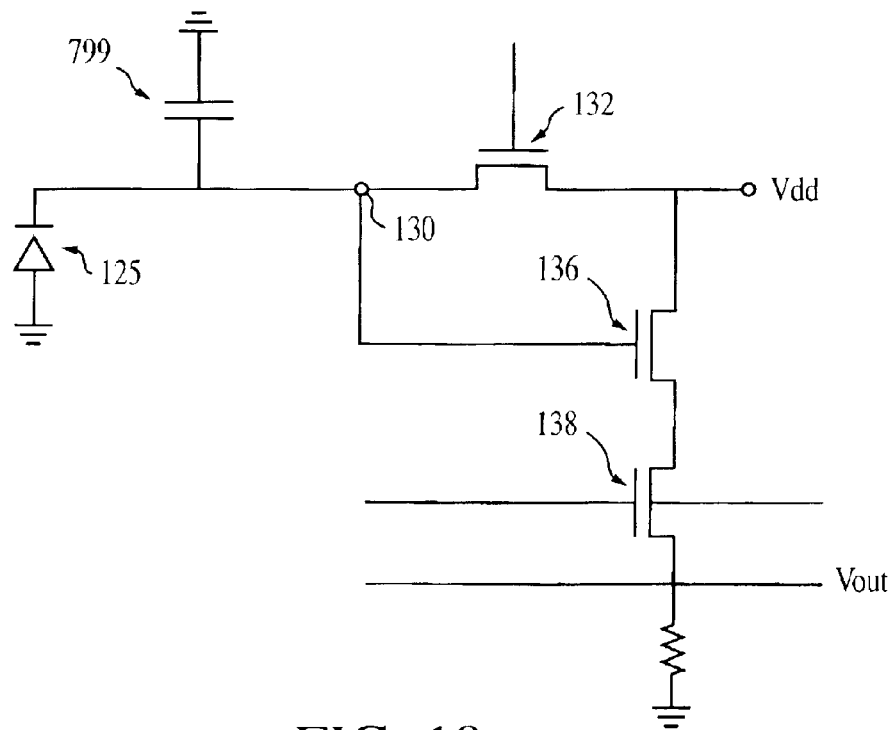
FIG. 18 is a schematic diagram of a pixel sensor cell fabricated in accordance with a seventh embodiment of the present invention.

FIG. 18 illustrates yet another embodiment of the present invention, according to which a storage capacitor 799 is formed over the field oxide region 115 as part of a three-transistor (3T) cell and not a four-transistor (4T) cell, as previously described with reference to FIG. 12, for example. The only difference between the structure of FIG. 18 and that of FIG. 12 is that the structure of FIG. 12 contains an additional fourth transistor, that is transfer transistor 128. Thus, storage capacitor 799 of FIG. 18 may be also formed entirely or only partially over the field oxide region 115 and connected to the photodiode 125 and the floating diffusion region 130. The processing steps for the fabrication of the storage capacitor 799 are similar to the processing steps described above with reference to FIGS. 4–11, except that the storage capacitor 799 is formed by itself over the field oxide region, and not simultaneously with the source follower gate of the source follower transistor.

Figure 19:
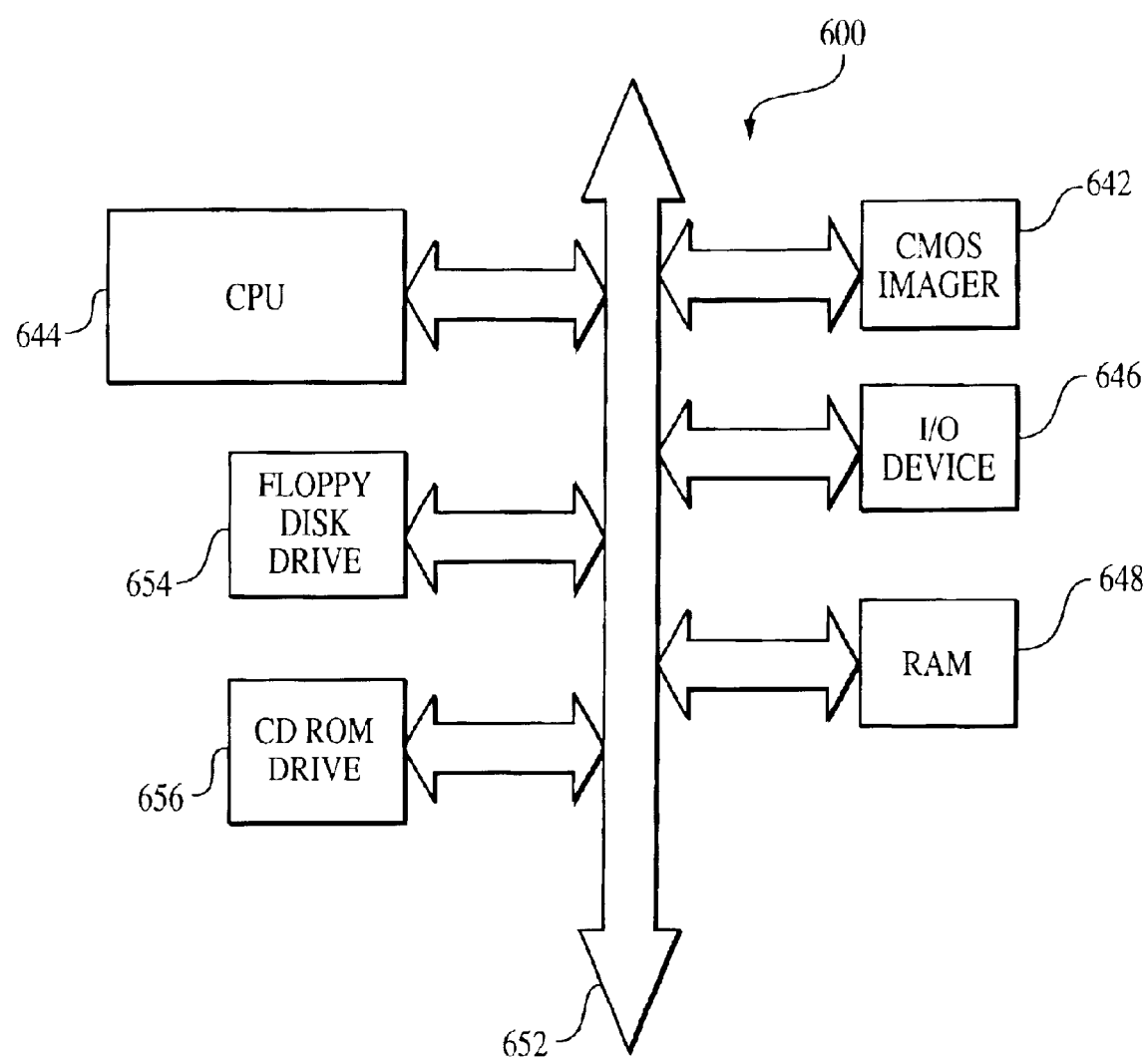
FIG. 19 is an illustration of a processing system utilizing the pixel sensor cells of the present invention.

A typical processor based system, which includes a CMOS image sensor according to the invention is illustrated generally at 642 in FIG. 19. A processor based system is exemplary of a system having digital circuits which could include CMOS image sensors. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS image sensor 642 also communicates with the system over bus 652. The computer system 600 also includes random access memory (RAM) 648, and, in the case of a computer system may include peripheral devices such as a floppy disk drive 654, and a compact disk (CD) ROM drive 656 or a flash memory card which also communicate with CPU 644 over the bus 652. It may also be desirable to integrate the processor 654, CMOS image sensor 642 and memory 648 on a single IC chip.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

It should be noted again that, although the invention has been described with specific reference to CMOS imaging circuits having a photodiode and a floating diffusion region, the invention has broader applicability and may be used in any CMOS imaging apparatus. The CMOS imaging sensor could have a photosensor consisting of a photodiode, a photogate, or a photoconductor to name just three possibilities. The CMOS imaging sensor may also include additional transistors and/or transistor elements, such as a global shutter transistor, for example. While the above-described embodiments illustrate a capacitor in a CMOS imager connecting (i) a diffusion region to an AC ground and (ii) a transistor gate to a diffusion region, the invention is not limited to the above-described embodiments. Accordingly, the present invention also contemplates a capacitor connecting the gates of two transistors, or a capacitor connecting a gate to a DC voltage, or a capacitor connecting a gate to an AC voltage, or a capacitor connecting a diffusion region to a DC voltage, or a capacitor connecting a diffusion region to an AC voltage, or a capacitor connecting two diffusion regions.

Also, although exemplary capacitor structures have been described and illustrated, many variations in capacitor structures could be made. Similarly, the processes described above are only exemplary of many that could be used to produce the invention. For example, although the invention has been described above with reference to the formation of planar capacitors, such as storage capacitor 199, for example, the invention has also application to other capacitor structures, for example, trench capacitors, stacked capacitors, metal capacitors, container capacitors, HSG capacitors, among others.

Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed is a new and desired to be protected by Letters Patent of the United States is:

1. A pixel sensor cell for use in a CMOS imaging device, said pixel sensor cell comprising:
   a field oxide region formed in a substrate;
   a doped layer of a first conductivity type formed in said substrate and adjacent said field oxide region;
   a photosensor including a charge collection region formed in said doped layer; and
   a charge storage capacitor having one electrode connected by an electrical contact to said charge collection region to store charge accumulated by said charge collection region, said charge storage capacitor overlying said field oxide region and wherein another electrode of said storage capacitor is connected to a gate of a transistor of said pixel sensor cell by another contact.

2. The pixel sensor cell according to claim 1, wherein said storage capacitor is a trench capacitor.

3. The pixel sensor cell according to claim 1, wherein said storage capacitor is a stacked capacitor.

4. The pixel sensor cell according to claim 1, wherein said storage capacitor is a metal capacitor.

5. The pixel sensor cell according to claim 1, wherein said storage capacitor is an HSG capacitor.

6. The pixel sensor cell according to claim 1, wherein said storage capacitor is a container capacitor.

7. The pixel sensor cell according to claim 1, wherein said storage capacitor is partially overlying said field oxide region.

8. The pixel sensor cell according to claim 1, wherein said storage capacitor is partially overlying over an active area of said photosensor.

9. The pixel sensor cell according to claim 1, wherein said storage capacitor is a flat plate capacitor.

10. The pixel sensor cell according to claim 9, wherein said storage capacitor is a flat plate capacitor including a first electrode, a second electrode and a dielectric layer between said first and second electrodes.

11. The pixel sensor cell according to claim 10, wherein said first and second electrodes are independently selected from the group consisting of doped polysilicon, hemispherical grained polysilicon, TiN, poly/WSix, polyTiSi$_2$, and poly/WNx/W.

12. The pixel sensor cell according to claim 1, wherein said transistor is a transfer transistor for transferring charge accumulated in a second doped region of said second conductivity type adjacent to said charge collection region, wherein the gate of said transfer transistor is formed adjacent said second doped region and said charge collection region.

13. The pixel sensor cell according to claim 1, wherein said storage capacitor is connected to said charge collection region by a metal contact.

14. The pixel sensor cell according to claim 1 wherein said transistor is a reset transistor.

15. The pixel sensor cell according to claim 1 wherein said transistor is a row select transistor.

16. The pixel sensor cell according to claim 1 further comprising a diffusion region of said second conductivity type adjacent said transfer transistor.

17. The pixel sensor cell according to claim 1 wherein said transistor is a source follower transistor.

18. The pixel sensor cell according to claim 1, wherein said transistor is a global shutter transistor.

19. The pixel sensor cell according to claim 1, wherein said photosensor comprises a photogate.

20. The pixel sensor cell according to claim 1, wherein said photosensor comprises a photodiode.

21. The pixel sensor cell according to claim 1, wherein said photosensor comprises a photoconductor.

22. The pixel sensor cell according to claim 1, wherein said another contact is a metal contact.

* * * * *

UNITED STATES PATENT AND TRADEMARK OFFICE
CERTIFICATE OF CORRECTION

PATENT NO. : 6,960,796 B2
DATED : November 1, 2005
INVENTOR(S) : Howard E. Rhodes et al.

It is certified that error appears in the above-identified patent and that said Letters Patent is hereby corrected as shown below:

Column 1,
Line 1, "CM OS" should read -- CMOS --;

Column 2,
Line 60, "cell of according" should read -- cell according --;

Column 5,
Line 35, "silicon-on-saphire" should read -- silicon-on-sapphire --; and Column 9,
Line 2, "lower electrode" should read -- lower electrodes --.

Signed and Sealed this

Seventh Day of March, 2006

JON W. DUDAS
*Director of the United States Patent and Trademark Office*